United States Patent
Cypher

(10) Patent No.: US 6,574,768 B2
(45) Date of Patent: *Jun. 3, 2003

(54) TECHNIQUE FOR CORRECTING SINGLE-BIT ERRORS AND DETECTING PAIRED DOUBLE-BIT ERRORS

(75) Inventor: Robert Cypher, Los Gatos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/933,293

(22) Filed: Aug. 20, 2001

(65) Prior Publication Data

US 2001/0056564 A1 Dec. 27, 2001

Related U.S. Application Data

(63) Continuation of application No. 09/160,215, filed on Sep. 24, 1998, now Pat. No. 6,301,680.

(51) Int. Cl.[7] ............................................. H03M 13/00
(52) U.S. Cl. ...................................... 714/758; 714/763
(58) Field of Search ........................ 714/758, 759–773, 714/752, 753–57, 746, 747–51, 761–62, 800–802

(56) References Cited

U.S. PATENT DOCUMENTS

| | | | |
|---|---|---|---|
| 3,648,239 A | * 3/1972 | Carter et al. ................. | 714/758 |
| RE30,187 E | 1/1980 | Hong et al. .................. | 714/758 |
| 4,334,309 A | 6/1982 | Bannon et al. .............. | 714/766 |
| 4,358,848 A | 11/1982 | Patel ........................... | 714/761 |
| 4,646,312 A | * 2/1987 | Goldsbury et al. .......... | 714/763 |
| 4,845,664 A | 7/1989 | Aichelmann, Jr. et al. .. | 711/105 |
| 4,862,462 A | 8/1989 | Zulian ......................... | 714/758 |
| 4,995,041 A | 2/1991 | Hetherington et al. ...... | 714/763 |
| 5,099,484 A | 3/1992 | Smelser ....................... | 714/761 |

(List continued on next page.)

OTHER PUBLICATIONS

Dell, "A White Paper on the Benefits of Chipkill–Correct ECC for PC Server Main Memory," IBM Microelectronics Division, Nov. 1997, pp. 1–23.

(List continued on next page.)

*Primary Examiner*—Albert Decady
*Assistant Examiner*—Guy Lamarre
(74) *Attorney, Agent, or Firm*—Meyertons Hood Kivlin Kowert & Goetzel, P.C.; B. Noël Kivlin

(57) ABSTRACT

A technique to detect and correct single bit errors and to detect paired bit errors in a data block. Two bits of the data block are paired and transferred on the same data path in different cycles. Check bits are computed prior to transferring the data block. A syndrome bits vector is computed when the data block is received. The syndrome bits vector includes a number of syndrome bits that is identical to the number of check bits. A value of the syndrome bits vector is used to detect and correct single bit errors and to detect paired double bit errors that occur in the data block without using an extended check bit. If the syndrome bits vector contains all zero bits, the data block is accepted without modification. If the syndrome bits vector is identical to a predetermined special vector V, a paired double bit error has occurred and either an unrecoverable error message is generated or a re-operation on the data block is requested. If the syndrome bits vector is not identical to V but contains bits that correspond to one of a plurality of assignment vectors, a single bit error is detected and corrected. Each of the assignment vectors corresponds to one of the bits in the data block and indicates what syndrome bits the corresponding bit in the data block is contributing to.

48 Claims, 7 Drawing Sheets

U.S. PATENT DOCUMENTS

| | | | | |
|---|---|---|---|---|
| 5,291,498 | A | | 3/1994 | Jackson et al. ............. 714/758 |
| 5,477,551 | A | * | 12/1995 | Parks et al. .................. 714/757 |
| 5,491,702 | A | * | 2/1996 | Kinsel ......................... 714/753 |
| 5,502,732 | A | * | 3/1996 | Arroyo et al. .............. 714/746 |
| 5,537,426 | A | | 7/1996 | Lee ............................. 714/785 |
| 5,642,366 | A | | 6/1997 | Lee et al. .................... 714/762 |
| 5,777,307 | A | | 7/1998 | Yamazaki ................... 235/454 |
| 5,784,391 | A | | 7/1998 | Konigsburg ................ 714/773 |
| 5,995,041 | A | * | 11/1999 | Bradley et al. .......... 342/357.1 |
| 6,301,680 | B1 | * | 10/2001 | Cypher ........................ 714/746 |
| 6,480,975 | B1 | * | 11/2002 | Arimilli et al. ............... 714/52 |

OTHER PUBLICATIONS

"Parallel Parity," http://bbs–koi.uniinc.msk.ru/tech1/1994/er_cont/block.htm, 1994, 1 pg.

"Modulo–2 Arithmetic," http://bbs–koi.uniinc.msk.ru/tech1/1994/er_cont/modulo.htm, 1994, 1 pg.

"Introduction to Error Control," http://bbs–koi.uniinc.msk.ru/tech1/1994/er_cont/intro.htm, 1994, 1 pg.

Barker et al. "ASCII Table," http://www.eng2.uconn.edu/cse/Cour...08W/References/Ref_ASCIITable.html, Feb. 1998, 1 pg.

"Parity & Computing parity," http://bbs–koi.uniinc.msk.ru/tech1/1994/er_cont/parity.htm, 1994, 2 pgs.

"Error Correction with Hamming Codes," http://bbs–koi.uniinc.msk.ru/tech1/1994/er_cont/hamming.htm, 1994, 2 pgs.

Barker et al. "Hamming Code, Background Information," http://www.eng2.uconn.edu/cse/Courses/CSE208W/Hamming/Background.html, Feb. 1998, 3 pgs.

Barker et al., "Hamming Code, Theory," http://www.eng2.uconn.edu/cse/Courses/CSE208W/Hamming/Theory.html, Mar. 1998, 2 pgs.

"NUMA: Delivering the Next Level of Commodity SMP Performance," http://199.245.235.23/newsletters/html/vpoint5.html, 1996, 4 pgs.

Barker et al. "General Definitions," http://www.eng2.uconn.edu/cse/Cour...8W/References/Ref_Definitions.html, Feb. 1998, 3 pgs.

Barker et al. "Hamming Code, Lab Procedure," http://www.eng2.uconn.edu/cse/Courses/CSE208W/Hamming/Procedure.html, Jun. 1998, 3 pgs.

Fujiwara et al., "Error Detecting Capabilities of the Shortened Hamming Codes Adopted for Error Detection in IEEE Standard 802.3," IEEE Transactions on Communications, vol. 37, No. 9, Sep. 1989, pp. 986–989.

Johansson, "Two Error–Detecting and Correcting Circuits for Space Applications," Proc. of the International Symposium on Fault–Tolerant Computing, Jun. 1996, pp. 436–439.

European Search Report, Application No. 99 30 7510, mailed Aug. 21, 2000.

Castagnoli et al., "Optimization of Cyclic Redundancy–Check Codes with 24 and 32 Parity Bits," IEEE Transactions on Communications, vol. 41, No. 6, Jun. 1993, pp. 883–892.

* cited by examiner

FIG. 2

| B: | 00 | 01 | 02 | 03 | 04 | 05 | 06 | 07 | 08 | 09 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 | 37 |
|---|---|---|---|---|---|---|---|---|---|---|---|---|---|---|---|---|---|---|---|---|---|---|---|---|---|---|---|---|---|---|---|---|---|---|---|---|---|---|
| Contents: | CC00 | CC01 | DD00 | CC02 | DD01 | DD02 | DD03 | CC03 | DD04 | DD05 | DD06 | DD07 | DD08 | DD09 | DD10 | CC04 | DD11 | DD12 | DD13 | CC05 | DD14 | DD15 | DD16 | DD17 | DD18 | DD19 | DD20 | DD21 | DD22 | DD23 | DD24 | DD25 | DD26 | DD27 | DD28 | DD29 | DD30 | DD31 |
| C[5] | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 1 | 1 |
| C[4] | 0 | 0 | 0 | 0 | 0 | 0 | 0 | 0 | 0 | 0 | 0 | 0 | 0 | 0 | 0 | 0 | 1 | 1 | 1 | 0 | 0 | 0 | 0 | 1 | 1 | 1 | 1 | 1 | 1 | 1 | 1 | 1 | 1 | 1 | 1 | 1 | 1 | 1 |
| C[3] | 0 | 0 | 0 | 0 | 0 | 0 | 0 | 0 | 1 | 1 | 1 | 1 | 1 | 1 | 1 | 0 | 0 | 0 | 0 | 0 | 1 | 1 | 1 | 0 | 0 | 0 | 0 | 1 | 1 | 1 | 1 | 1 | 1 | 1 | 1 | 1 | 1 | 1 |
| C[2] | 0 | 0 | 0 | 0 | 1 | 1 | 1 | 0 | 0 | 0 | 0 | 1 | 1 | 1 | 1 | 0 | 0 | 0 | 1 | 0 | 1 | 1 | 1 | 0 | 0 | 0 | 1 | 0 | 0 | 0 | 1 | 0 | 0 | 0 | 0 | 1 | 1 | 1 |
| C[1] | 0 | 0 | 0 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 |
| C[0] | 0 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 |

| B: | Contents: | S[5] | S[4] | S[3] | S[2] | S[1] | S[0] |
|---|---|---|---|---|---|---|---|
| 00 | CC01 | 0 | 0 | 0 | 0 | 0 | 1 |
| 01 | CC01 | 0 | 0 | 0 | 0 | 1 | 0 |
| 02 | DC02 | 0 | 0 | 0 | 0 | 1 | 1 |
| 03 | CC02 | 0 | 0 | 0 | 1 | 0 | 1 |
| 04 | D001 | 0 | 0 | 0 | 1 | 0 | 1 |
| 05 | DD0123 | 0 | 0 | 0 | 1 | 1 | 0 |
| 06 | DD03 | 0 | 0 | 0 | 1 | 1 | 1 |
| 07 | CC03 | 0 | 0 | 1 | 0 | 0 | 0 |
| 08 | DD04 | 0 | 0 | 1 | 0 | 0 | 1 |
| 09 | DD05 | 0 | 0 | 1 | 0 | 1 | 0 |
| 10 | DD06 | 0 | 0 | 1 | 0 | 1 | 1 |
| 11 | DD07 | 0 | 0 | 1 | 1 | 0 | 0 |
| 12 | DD08 | 0 | 0 | 1 | 1 | 0 | 1 |
| 13 | DD09 | 0 | 0 | 1 | 1 | 1 | 0 |
| 14 | D10 | 0 | 0 | 1 | 1 | 1 | 1 |
| 15 | C04 | 0 | 1 | 0 | 0 | 0 | 0 |
| 16 | D11 | 0 | 1 | 0 | 0 | 0 | 1 |
| 17 | D123 | 0 | 1 | 0 | 0 | 1 | 0 |
| 18 | DD13 | 0 | 1 | 1 | 1 | 1 | 1 |
| 19 | C15 | 1 | 0 | 0 | 0 | 0 | 0 |
| 20 | D14 | 1 | 0 | 1 | 1 | 0 | 1 |
| 21 | DD15 | 1 | 0 | 1 | 1 | 1 | 0 |
| 22 | D16 | 1 | 0 | 1 | 1 | 1 | 1 |
| 23 | D17 | 1 | 1 | 0 | 0 | 0 | 0 |
| 24 | D18 | 1 | 1 | 0 | 0 | 0 | 1 |
| 25 | D19 | 1 | 1 | 0 | 0 | 1 | 0 |
| 26 | D20 | 1 | 1 | 0 | 0 | 1 | 1 |
| 27 | D21 | 1 | 1 | 0 | 1 | 0 | 0 |
| 28 | D22 | 1 | 1 | 0 | 1 | 0 | 1 |
| 29 | D23 | 1 | 1 | 0 | 1 | 1 | 0 |
| 30 | D24 | 1 | 1 | 0 | 1 | 1 | 1 |
| 31 | D25 | 1 | 1 | 1 | 0 | 0 | 0 |
| 32 | D26 | 1 | 1 | 1 | 0 | 0 | 1 |
| 33 | D27 | 1 | 1 | 1 | 0 | 1 | 0 |
| 34 | D28 | 1 | 1 | 1 | 0 | 1 | 1 |
| 35 | D29 | 1 | 1 | 1 | 1 | 0 | 0 |
| 36 | D30 | 1 | 1 | 1 | 1 | 0 | 1 |
| 37 | D31 | 1 | 1 | 1 | 1 | 1 | 0 |

TECHNIQUE FOR CORRECTING SINGLE-BIT ERRORS AND DETECTING PAIRED DOUBLE-BIT ERRORS

This application is a continuation application of U.S. patent application Ser. No. 09/160,215, filed Sep. 24, 1998, now U.S. Pat. No. 6,301,680.

BACKGROUND OF THE INVENTION

1. Field of the Invention

This invention relates to error correction and detection and, more particularly, to systems that employ error codes to detect and correct bit errors.

2. Description of the Relevant Art

Error codes are commonly used in electronic systems to detect and correct data errors, such as transmission errors or storage errors. For example, error codes may be used to detect and correct errors of data transmitted via a telephone line, a radio transmitter, or a compact disc laser. Error codes may additionally be used to detect and correct errors of data stored in the memory of computer systems. One common use of error codes is to detect and correct errors of data transmitted on a data bus of a computer system. For example, error correction bits, or check bits, may be generated for data prior to transferring the data on a data bus. When the data are received, the check bits may be used to detect and correct errors within the data. Errors may be introduced either due to faulty components or noise within the computer system. Faulty components may include faulty memory devices, faulty bus interface units, or faulty data paths between devices within a system, such as faulty pins, faulty data traces, or faulty wires.

Hamming codes are a commonly used type of error code. The check bits in a Hamming code are parity bits for portions of the data bits. Each check bit provides the parity for a unique subset of the data bits. If an error occurs, i.e. one or more bits change state, one or more of the check bits will change state (assuming the error is within the class of errors covered by the code). Information regarding the particular check bits that change state may also be used to determine which data bit changes state, and to correct the error. For example, if one data bit changes state, this data bit will modify one or more check bits. Because each data bit contributes to a unique group of check bits, the check bits that are modified will identify the data bit that changed state. The error may be corrected by inverting the bit identified to be erroneous.

One common use of Hamming codes is to correct single bit errors within a group of data. Generally speaking, the number of check bits must be large enough such that $2^k-4$ is greater than or equal to n, where k is the number of check bits and n is the number of data bits plus the number of check bits. Accordingly, seven check bits are required to implement a single error correcting Hamming code for 64 data bits. A single error correcting Hamming code is capable of detecting and correcting a single error.

In a single error correcting Hamming code, a set of syndrome bits is generated upon receipt of data. The syndrome bits are used to detect a single bit error. The syndrome bits further identify the position of the error, and thus can be used to correct the single bit error by inverting a value in the identified position. However, single bit error correcting Hamming codes fail to detect two bits errors which may occur during the transfer of data. Further, multiple bit errors may erroneously appear as a single bit error and may cause an incorrect identification of a position of the erroneous bit. Therefore, a bit that is not erroneous may be inverted. In the latter situation, the error correction procedure creates more errors and may erroneously indicate that the data is correct.

The error detection capability of the code may be increased by adding an additional check bit. The use of an additional check bit allows the Hamming code to detect two single bit errors and to detect and correct single bit errors. The addition of a bit to increase the error detection capabilities of a Hamming code is referred to as an extended Hamming code. The extended check bit is regenerated when the syndrome bits are generated. The regenerated extended check bit is compared to the original extended parity bit. If one or more syndrome bits are asserted and the regenerated extended parity bit is different than the original extended check bit, a single bit error has occurred and is corrected. Alternatively, if one or more syndrome bits are asserted and the regenerated extended parity bit is the same as the original extended check bit, two bit errors are detected and no correction is performed. In the latter case, an uncorrectable error may be reported to a bus interface unit or other component within the computer system. It is noted that more than two bit errors in a logical group is not within the class of errors addressed by the error correction code. Accordingly, three or more errors may go undetected or the error correction code may interpret the errors as a single bit error and invert a data bit that was not erroneous.

It is a common design goal in computer systems to reduce the number of check bits used to detect and correct errors. The check bits increase the amount of data handled by the system, which may increase the circuitry and data paths required for transferring the data. Further, the increased number of bits increases the probability of an error. Although the check bits may make an error detectable and/or correctable, increasing the number of bits within the system increases the probability of an error occurring. For at least these reasons, it is desirable to decrease the number of check bits for a given level of error detection and/or correction.

SUMMARY OF THE INVENTION

The problems outlined above are in large part solved by a technique for correcting single bit errors and detecting paired double bit errors in accordance with the present invention. In one embodiment of the present invention, a data block containing both data bits and check bits is transferred on a data bus. The data bus includes a plurality of wires, or signal paths. Paired bits of the data block are transferred on each of the wires (the same wire) of the data bus during different bus cycles. Check bits are assigned to the data block to detect errors that may occur during the transfer of the data block. Each check bit is calculated from a respective subset of data bits in the data block.

When the data block is received, syndrome bits are calculated. A syndrome bit is calculated using a corresponding check bit and a selected subset of data bits that is assigned to that check bit. The plurality of syndrome bits forms a syndrome bits vector. The number of syndrome bits in the syndrome bits vector is identical to the number of check bits. Thus, each syndrome bit in the syndrome bits vector corresponds to one of the check bits.

Upon the generation of the syndrome bits vector, if the syndrome bits vector has all zero bits, no error (within the class of errors covered by the error code) is detected and the data is provided to the receiving system without correction. If at least one syndrome bit in the syndrome bits vector is asserted and the syndrome bits vector is not identical to a special vector V, a single bit error is detected. The syndrome bits may be used to locate the bit position of an erroneous bit and the error may be corrected by inverting the bit in that bit position. If the syndrome bits vector is identical to the special vector V, a paired double bit error is detected and either an uncorrectable error is reported or a signal is generated to re-operate on the data block. Accordingly, the presence of two bit errors transferred on the same wire, or data path, may be detected without the need for an additional check bit.

The special vector V includes a number of bits that is equal to the number of check bits. At least two of the bits of V must have a value of one (binary one). Generally speaking, the computation of the syndrome bits may be represented with a syndrome bits assignment table. The syndrome bits assignment table contains a number of columns that is equal to the number of bits in the data block, and a number of rows that is equal to the number of check bits in the data block. Each column in the syndrome bits assignment table represents an assignment vector that corresponds to a bit position in the data block and indicates which syndrome bits the value in that bit position is contributing to.

Assignment vectors represented within the syndrome bits assignment table have the following attributes: (1) each assignment vector that corresponds to a particular check bit position in the data block has only a single bit asserted (i.e. a single "1") corresponding to the syndrome bit associated with that particular check bit, (2) each assignment vector that corresponds to a data bit position in the data block has at least two bits asserted (i.e. two "1s"), (3) none of the assignment vectors can be identical to the special vector V, (4) each assignment vector that corresponds to a data bit position in the data block is unique; and (5) the XOR of any two assignment vectors that correspond to paired bit positions (i.e. two bits that are transferred by the same wire) in the data block result in the special vector V.

Broadly speaking, the invention contemplates a system for detecting and correcting errors in a data block. The data block includes data bits and check bits. The system comprises: a transmitter configured to generate the check bits and to transfer the data block, a bus coupled to the transmitter that includes a plurality of data paths for conveying the data block such that paired bits of the data block are conveyed on each of data paths, and a receiver coupled to the bus and configured to receive the data block and to generate a syndrome vector. The syndrome vector includes a plurality of syndrome bits and is used to detect and correct single bit errors and to detect paired double bits errors in the data block.

BRIEF DESCRIPTION OF THE DRAWINGS

Other objects and advantages of the invention will become apparent upon reading the following detailed description and upon reference to the accompanying drawings in which:

FIG. 2 is an illustration of a check bits assignment table for an error correction unit that detects/corrects single bit errors and detects paired double bit errors according to one embodiment of the present invention;

FIG. 3 is an illustration of a syndrome bits assignment for an error correction unit that detects/corrects single bit errors and detects paired double bit errors according to one embodiment of the present invention;

FIG. 5 is an illustration if the check bits assignment table of FIG. 2 according to one embodiment of the present invention;

Figure 1:
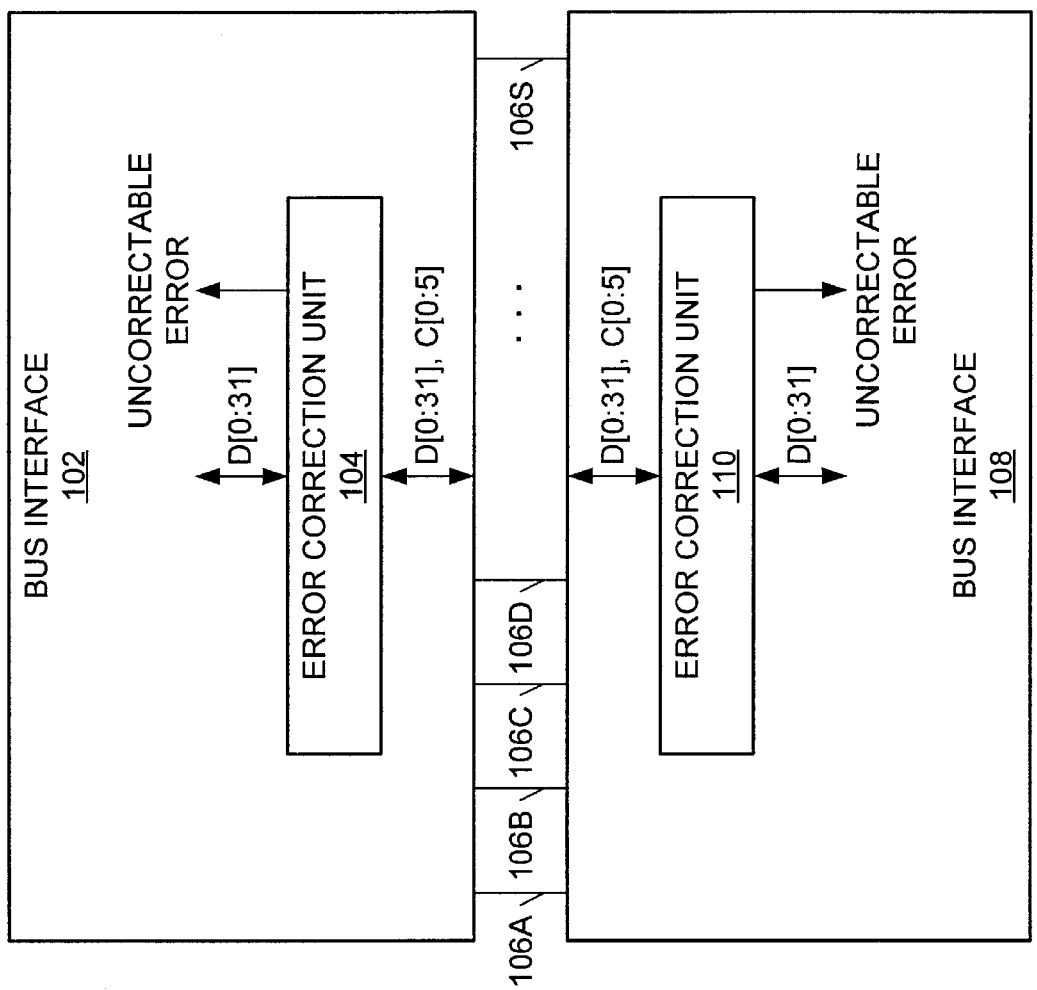
FIG. 1 is a block diagram of a data bus that includes error correction units capable of detecting and correcting single bit errors and detecting paired double bit errors according to one embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to FIGS. 1–3, an embodiment of a system to detect and correct single bit errors and to detect paired double bit errors is shown. In FIG. 1, a block diagram of a data bus system that includes error correction units capable of detecting and correcting single bit errors and paired double bit errors according to one embodiment of the present invention is shown. The data bus system includes bus interface unit 102, data paths 106A–106S, and bus interface unit 108. It is noted that components identified by a reference number followed by a letter may be collectively referred to by the reference number alone. For example, data paths 106A–106S may be collectively referred to as data paths 106. Bus interface unit 102 includes error correction unit 104, and bus interface unit 108 includes error correction unit 110.

Generally speaking, bus interface unit 102 provides data bits to error correction unit 104. Error correction unit 104 generates a plurality of check bits to enable the detection and correction of single bit errors and the detection of paired double bit errors. Error correction unit 104 provides the data block, which includes the data bits and check bits, to data paths 106. Data paths 106 may be wires, data traces, or other components that transfer data in electronic systems. The data block is received by error correction unit 110. Error correction unit 110 uses the check bits to verify the accuracy of the data bits. If a correctable error is detected, the erroneous bit is located and inverted, and the data provided to bus interface 108. Alternatively, if an uncorrectable error is detected, an uncorrectable error signal is asserted or a signal is generated to initiate a re-operation on the data block. The bus interface unit may report an uncorrectable error to another component in the system or may request the transfer of the data again. Data may be transferred in a similar manner from bus interface 108 to bus interface 102. Although the present invention is discussed in relation to transferring data on a data bus, other systems that employ error codes are contemplated. For example, an error code in accordance with the present invention may be implemented in a computer memory system. Check bits may be generated prior to storing a data block and regenerated when the data block is read from memory.

In the illustrated embodiment, error correction unit 104 receives 32 data bits from bus interface 102. Error correction unit 104 generates six check bits for the 32 data bits. Accordingly, a 38-bit data block is transferred to bus interface 108. Each of the check bits is generated in accordance with a particular assignment of data bits to that check bit. A unique subset of data bits is assigned to compute each check bit.

A check bits assignment table such as that of FIG. 2 may be used to illustrate the assignment of the data bits to the check bits. The bit positions of the 38 bits of the data block are denoted B[0:37]. As mentioned above, the data block contains six check bits (C[0:5]) and 32 data bits (D[0:31]). The second row of the check bits assignment table in FIG. 2 shows the content of positions B[0:37] in the data block. For example, bit position zero (B[0]) contains the value of check bit 0 (C[0]), bit position 10 (B[10]) contains the value of data bit 6 (D[6]), and bit position 31 (B[31]) contains the value of data bit 25 (D[25]), and so on. The remaining rows of the table identify the data bits which are used to generate each corresponding check bit. The "1s" in the column positions of the table indicate that the value in the corresponding bit position is assigned to calculate the corresponding check bit. For example, the values in D[14:31] are used to compute check bit C[5]. The "0s" in the column positions indicate that the value in the corresponding position is not used to compute the corresponding check bit. Therefore, each row in FIG. 2 corresponds to a check bit and contains a unique nonempty subset of data bits that are assigned to compute that check bit. In one embodiment, the check bits are computed by the XOR (exclusive-OR) of the data bits in the subsets assigned to the check bits. If the data is to be moved from bus interface 102 to bus interface 108, the check bits are computed in error correction unit 104. Alternatively, if the data is to be transferred from bus interface 108 to bus interface 102, the check bits are computed in error correction unit 110.

In the illustrated embodiment of FIG. 1, 19 data paths (106A–106S) that connect bus interface 102 to bus interface 108 are shown. Therefore, two bits of the data block are transferred on each data path. In this embodiment, 19 bits (B[0:18]) of the 38-bit data block (B[0:37]) are transferred on wires 106A–106S in a first cycle. The remaining 19 bits B[19:37] are transferred on wires 106A–106S on the next cycle. In this particular embodiment, each wire transfers bit B(x) and B(37-x). In other words, bits B[0] and B[37] are transferred on the same data path and paired for the purposes of error detection. Likewise, bits B[1] and B[36] are transferred on the same data path and paired for error correction purposes, etc. The six check bits, C[0:5], are used to detect and correct single bit errors and to detect paired two bit errors within the data block. For example, the pairs of bits transferred on the same data paths may be defined as pairs for the purpose of error detection and correction. It is advantageous to detect errors that occur on the same data path so that a data path failure cannot introduce an undetectable error into the data block.

In one embodiment, the six check bits of the data block implement a single error correcting Hamming code. As discussed above, single error correcting Hamming codes may be extended to detect two bit errors by adding an additional check bit. In this embodiment, however, paired two bit errors are advantageously detected without increasing the number of check bits required for a single error correcting Hamming code. Generally speaking, each data block is assigned a unique set of check bits that are transferred when the data block is transferred. When the data block is received, a corresponding set of syndrome bits is calculated and used to detect and correct single bit errors and to detect paired double bit errors that may occur during the transfer of the data block.

The computation of the syndrome bits may be illustrated using a syndrome bits assignment table such as that illustrated in FIG. 3. The syndrome bits assignment table indicates which bits of the data block (including both data bits and check bits) are contributing to the generation of each of the syndrome bits. In one embodiment, each syndrome bit is computed by XORing a subset of the transferred data bits along with a corresponding check bit. For example, syndrome bit S[5] is computed by an XOR operation of the values of the data bits D[14:31] and the value of check bit C[5] (or, equivalently, the XOR of B[19:37]). If the data is to be transferred from bus interface 102 to bus interface 108, the syndrome bits are computed in error correction unit 110. Alternatively, if the data is to be transferred from bus interface 108 to bus interface 102, the syndrome bits are computed in error correction unit 104. The specific manner in which bits of the data block are assigned for generating the syndrome bits (as exemplified by FIG. 3) will be discussed in detail below.

The syndrome bits computed by the error correction unit 104 or 110 that receives the data block form a syndrome bits vector S[5:0]. A value of the syndrome bits vector may be used to detect and correct single bit errors and to detect paired double bit errors in the transferred data block. If all syndrome bits (S[0:5]) have a value of zero, i.e., the syndrome bits vector is 000000, no errors within the class of errors covered by the code are present and the data is accepted without correction. If, on the other hand, the computed syndrome bits result in a vector equaling a special vector "V", a paired double bit error is detected. This may result in the system generating an error message or in a request for a re-operation to be performed upon the data block. For the embodiment illustrated by the syndrome bits assignment table of FIG. 3, the special vector V is "111111". Details regarding this special vector V will be provided further below.

Finally, if the computed syndrome bits result in a syndrome bits vector which is neither all zero and which is not equal to the special vector V, a single error may have occurred and the value of the syndrome bits vector indicates the position of the erroneous bit. In this case, if the resulting syndrome bits vector corresponds to one of the columns in FIG. 3 (which also corresponds to a bit position), this column identifies the position of the erroneous bit, and the erroneous bit may be inverted to correct the error. For example, if the syndrome bits S[5:0] are "001101", the syndrome bits vector corresponds to bit position B[12] in FIG. 3 containing D[8]. Thus, D[8] is the erroneous bit. This erroneous bit may be corrected by inverting the value in that position. It should be noted that if the syndrome bits vector in this case (i.e., it is neither all zero and it does not equal the special vector V) does not correspond with one of the columns in FIG. 3, the system may be configured such that an unrecoverable error message is generated or a re-operation on the data block is requested.

As illustrated in the discussion above, the particular check bits to which each data bit contributes may be represented by a check bits assignment table. Similarly, the particular syndrome bits to which each bit of the data block contributes may be represented by a syndrome bits assignment table. The characteristics of these assignments will be next considered (with the aid of FIGS. 4 and 5) in addition to their relationship to the special vector V.

Figure 4:
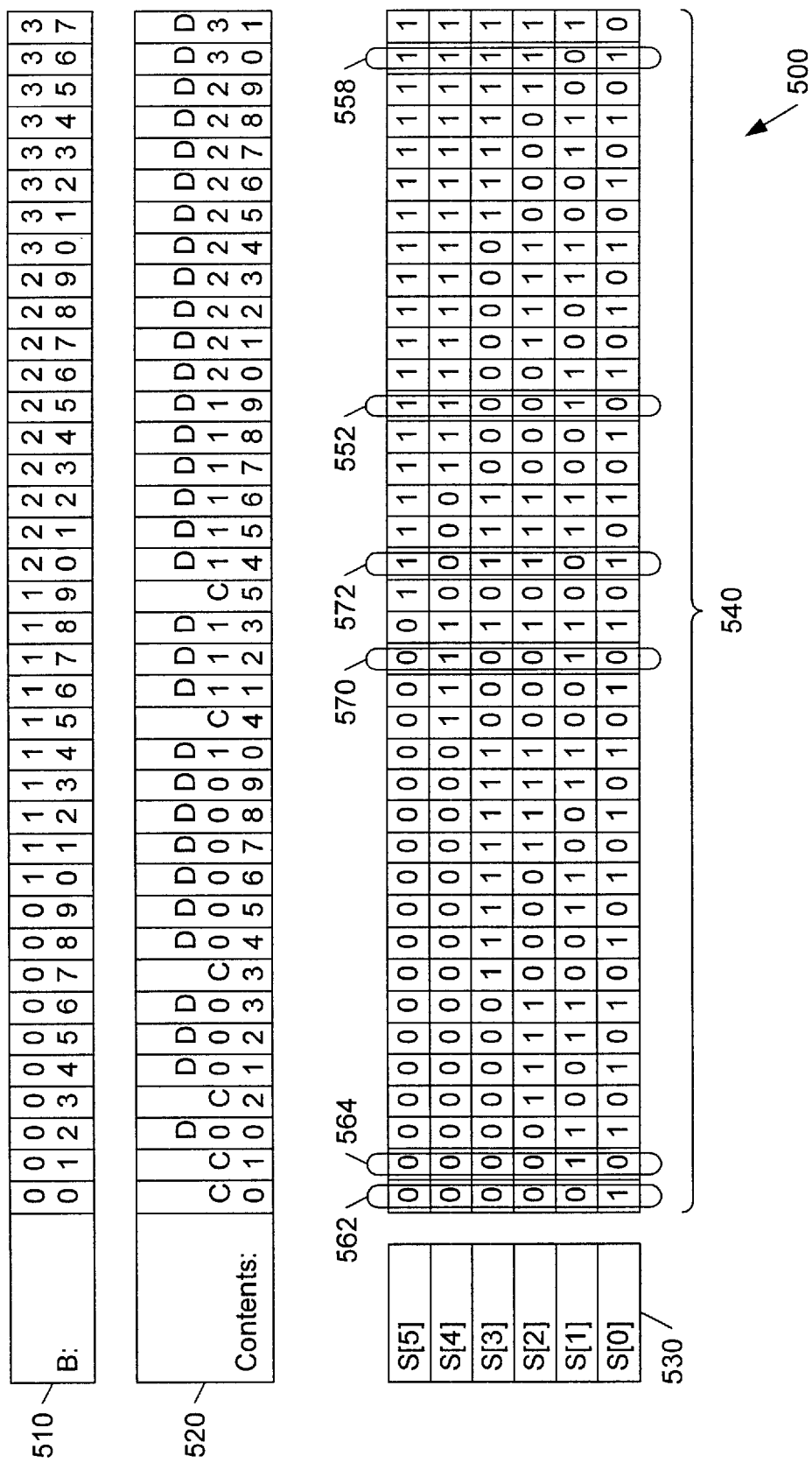
FIG. 4 is an illustration of the syndrome bits assignment table of FIG. 3 according to one embodiment of the present invention.
Figure 5:
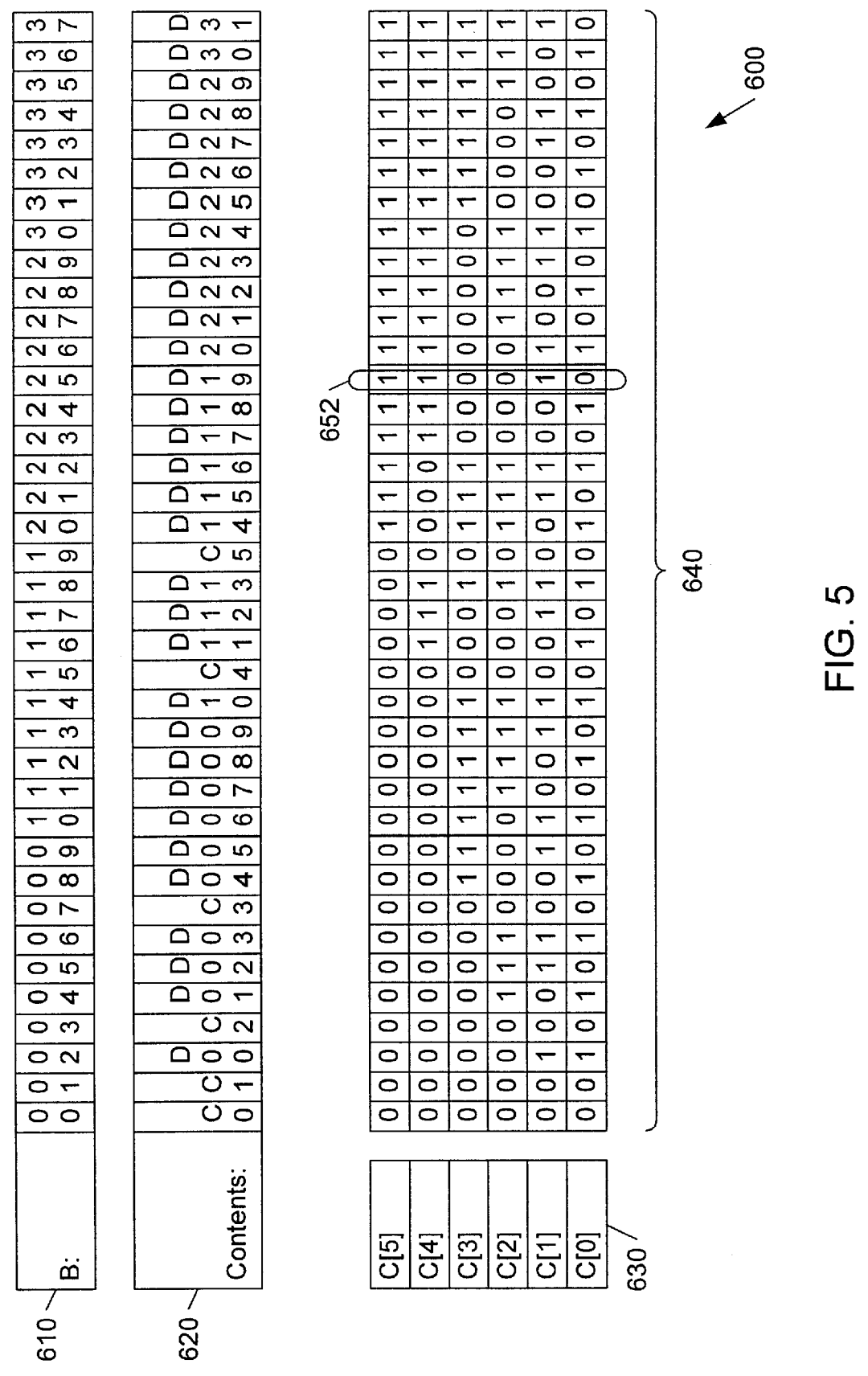

Turning now to FIGS. 4 and 5, additional illustrations of the syndrome bits assignment table and the check bits assignment table discussed previously are shown. As stated before, the number of check bits needed for the data block is determined based on the number of data bits. The bits of the data block are assigned into pairs, where each pair is to be transferred by an individual data path of the system. For the illustrated example, the bits of the 38-bit data block are assigned into 19 pairs, and each pair is transmitted by an individual wire of the 19-wires data bus during two cycles.

During the design of the system, a special vector V may first be reserved. The special vector V is selected to include a number of bits that is equal to the number of check bits to be transmitted in the data block. V is also selected such that at least two bits have a binary value of "1". For example, in the case of 38-bit data block, V may be any vector of six bits that includes at least two 1s, such as [010101], [100001], [011101], or [111111]. In the particular example discussed herein, the special vector V is [111111].

To better facilitate the discussion, the syndrome bits assignment table is referred to as including a number of "assignment" vectors 540, each corresponding to a column for a particular bit position in the data block (both data bits and check bits). Thus, for this specific example, the syndrome bits assignment table has 38 assignment vectors. For example, assignment vector 552 corresponds to bit position 25 in the data block (which contains the value of data bit D19). Similarly, assignment vector 564 corresponds to bit position 1 in the data block (which contains the value of check bit C1).

Each assignment vector depicts the particular syndrome bits to which the corresponding bit of the data block contributes. For example, the assignment vector 552 indicates that the value contained in position 25 of the data block is included in the computations of syndrome bits S[5], S[4], and S[1]. The assignment vector 558 indicates that the value in the bit position 36 is used in the computation of all syndromes bits 530 except S[1], and so on.

Generally speaking, the assignment vectors represented by the syndrome bits assignment table have the following attributes:

(1) Each assignment vector that corresponds to a particular check bit position in the data block has only a single bit asserted (i.e. a single "1") at a position in the vector that corresponds to the syndrome bit associated with that particular check bit. For example, assignment vector 562 (corresponding to the bit position for the check bit C0) has only one asserted bit at a position in the vector that corresponds to the syndrome bit S[0]. Similarly, assignment vector 564 corresponding to check bit C1 has only one asserted bit that corresponds to syndrome bit S[1], and so on.

(2) Each assignment vector that corresponds to a data bit position in the data block has at least two bits asserted (i.e. two "1"). For example, assignment vector 552, [110010], has three bits asserted.

(3) None of the assignment vectors can be identical to the special vector V. In the particular embodiment of FIG. 4, the special vector V is [111111]. Therefore none of the assignment vectors 540 as illustrated in FIG. 4 has all bits asserted.

(4) Each assignment vector 540 that corresponds to a data bit position in the data block is unique.

(5) The XOR of any two assignment vectors 540 that correspond to paired bit positions (i.e. two bits that are transferred by the same wire) in the data block result in the special vector V. In the particular embodiment of FIG. 4, the values of bit positions (x) and (37-x) are transferred on the same wire. Thus, values in bit positions 0 and 37, 1 and 36, 2 and 35, . . . , 18 and 19 are transferred (using two cycles) by wires 106A–106S, respectively. Therefore, the XOR of assignment vector 564 (corresponding to bit position 1) and assignment vector 558 (corresponding to bit position 36) results in the special vector V, i.e. [000010] XOR [111101]= [111110]. Similarly, the XOR of assignment vector 570 (corresponding to bit position 17) and assignment vector 572 (corresponding to bit position 20) results in the special vector V, i.e. [010010] XOR [101101]=[111111], and so on.

It is noted that in other embodiments, other values for the special vector V may be designated and other assignment vectors may be formed. In general, the characteristics and relationships associated with the special vector V and assignment vectors need only conform to the attributes described above.

In FIG. 5, the check bits assignment table described previously is again illustrated. The check bits assignment table may be derived from the syndrome bits assignment table 500 by copying the assignment vectors 540 that correspond to data bit positions in 510 into the assignment section 640 of the check bits assignment table 600. For example, column 652 in section 640 corresponds to the bit position 25 (which contains the value of data bit 19, or D[19]) is identical to the assignment vector 552 in FIG. 4, and so on.

Once the check bits assignment table and the syndrome bits assignment table are constructed, any suitable design or approach may be used to implement the system in software and/or hardware. This implementation enables a system to detect and correct single bit errors and to detect paired double bit errors while transferring or storing data. For example, error correction units 104 may encode the data with check bits and error correction unit 110 may decode the received data block and detect/correct single bit errors and detect paired double bit errors, or visa versa.

Figure 6:
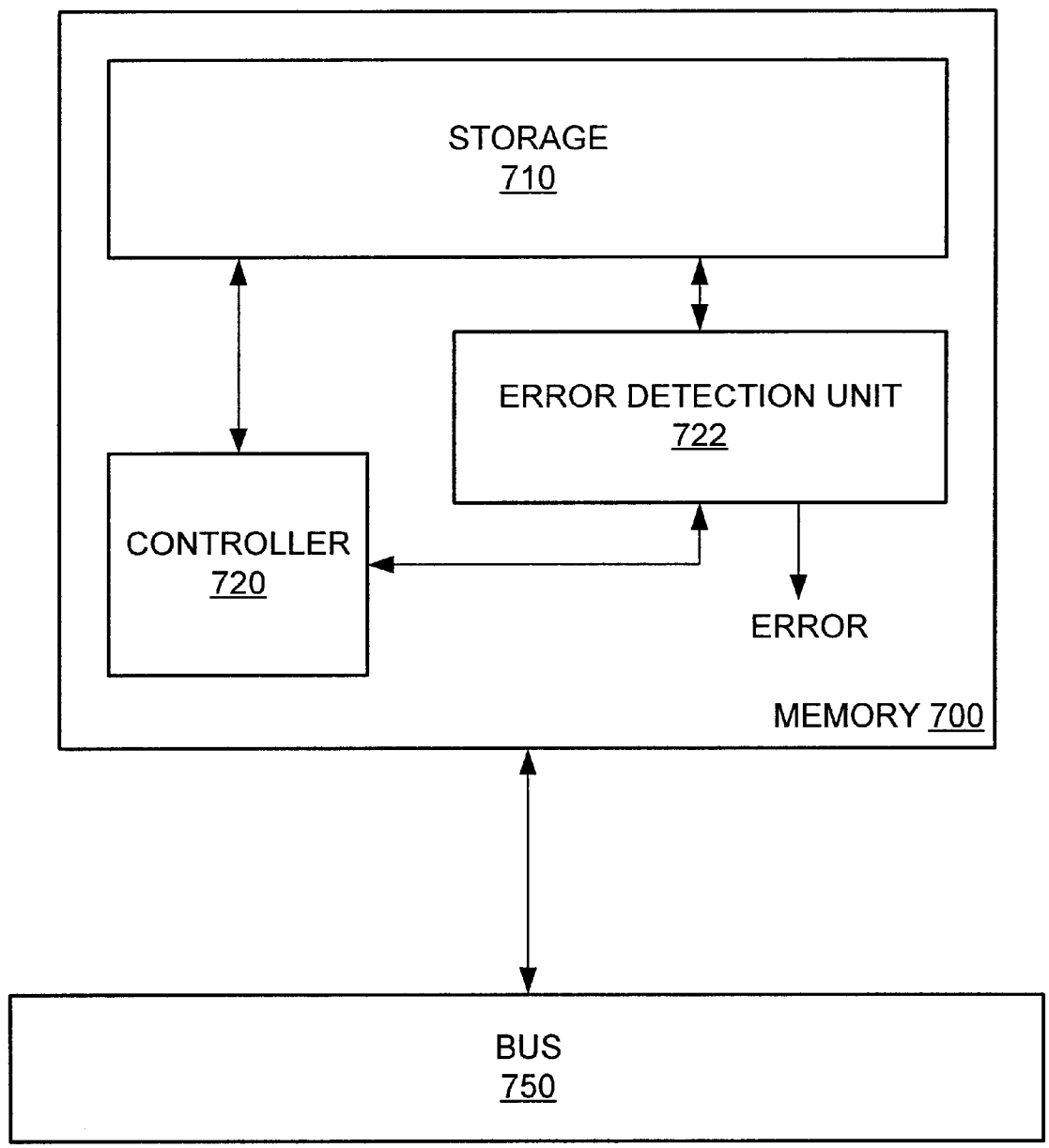
FIG. 6 is a block diagram of a memory system including error correction units capable of detecting and correcting single bit errors and detecting paired double bit errors according to one embodiment of the present invention.

Turning now to FIG. 6, a block diagram of a memory system that is capable of detecting and correcting single bit errors and detecting paired double bit errors is shown. The memory system 700 can be any system that is used or configured to store data. For example, memory system 700 may be a system memory in a computer system, a cache in a microprocessor or a computer system, or simply a data storage system capable of providing responses to read and write requests on the stored data. For simplicity, the memory system 700 is shown to include a storage element 710 providing physical storage for the data, a memory controller 720 to control the flow of the data within the memory system 700 and between the memory system 700 and external devices, and an error correction unit 770. It should be noted that other configurations of the memory system 700 are possible and the memory system 700 should not be viewed to restrict other possible configurations of memories. The memory system 700 may be coupled to other components such as bus 750. Controller 720 controls the data flow in the memory system 700 where data blocks are transferred through the error correction unit 722 to the storage 710. The data stored in the storage 710 is also retrieved through the error correction unit 722. The error correction unit 722 is configured in accordance with the forgoing description to detect paired double bit errors with respect to data blocks stored and retrieved from storage 710.

Figure 7:
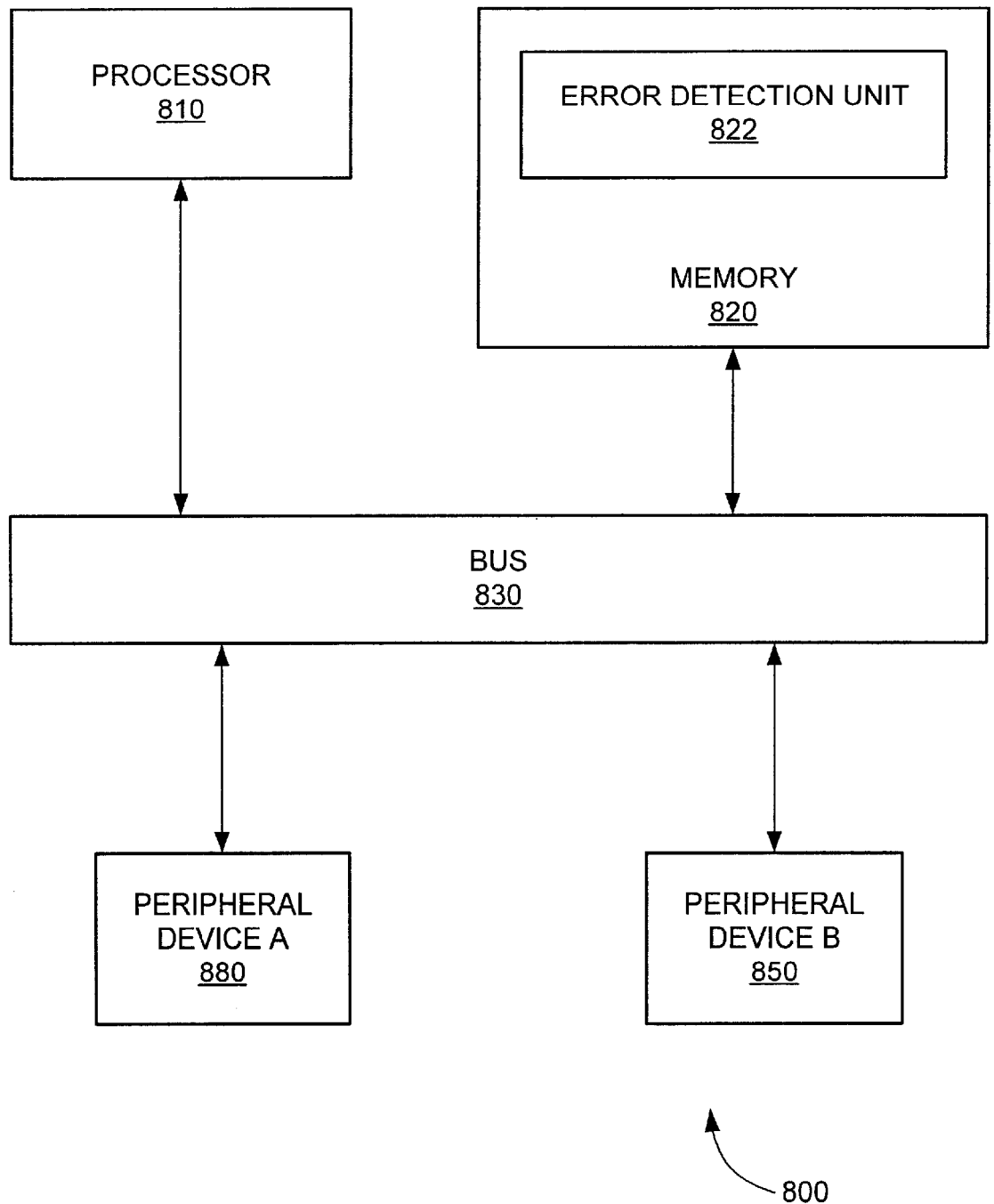
FIG. 7 is a block diagram of a computer system including error correction units capable of detecting and correcting single bit errors and detecting paired double bit errors according to one embodiment of the present invention.

Turning now to FIG. 7, a block diagram of a computer system that is capable of detecting and correcting single bit errors and detecting paired double-bit errors is shown. Computer system 800 utilizes an error detection unit 822 in accordance with the foregoing description within memory 820. Instructions executed in processor 810 control data movements between processor 810 and memory 820, and between peripheral devices 880 and 850 and memory 820. It should be noted that the number of buses, processors, and peripheral devices may vary within system 800. Error detection unit 822 may be included within memory 820 or outside memory 820, such as in processor 810, bus 830, in a cache, within a peripheral device, or within a combination of such elements of the system. Furthermore, more than one error detection unit 822 may be employed at various locations within the computer system 800 or other elements where movements of data are needed.

While the present invention has been described with reference to particular embodiments, it will be understood that the embodiments are illustrative and that the invention scope is not so limited. Any variations, modifications, additions and improvements to the embodiments described are possible. These variations, modifications, additions and improvements may fall within the scope of the invention as detailed within the following claims.

What is claimed is:

1. A system for detecting and correcting errors in a data block, wherein said data block includes a plurality of bits, and wherein said plurality of bits includes data bits and check bits, said system comprising:
    a first bus interface unit including a first error correction unit, wherein said first error correction unit is configured to generate said check bits and to transfer said data block;
    a bus coupled to said first bus interface unit, wherein said bus includes a plurality of data paths for conveying said data block, wherein said plurality of data paths is fewer than said plurality of bits, and wherein paired bits of said data block are conveyed on each of said plurality of data paths;
    wherein selected ones of said plurality of data paths convey paired data bits, wherein each of said check bits is dependent upon one of but not both of said paired data bits conveyed on a given data path; and
    a second bus interface unit including a second error correction unit coupled to said bus, wherein said second error correction unit is configured to receive said data block and to generate a syndrome vector including a plurality of syndrome bits dependent upon said check bits, and wherein said syndrome vector is used to detect and correct single bit errors and to detect paired double bits errors in said data block.

2. The system as recited in claim 1, wherein additional ones of said data paths convey a paired data bit/check bit.

3. The system as recited in claim 2, wherein each data bit associated with a given data bit/check bit pair is used to calculate each check bit other than said check bit associated with said given data bit/check bit pair.

4. The system as recited in any of claim 3, wherein an exclusive-OR operation of a given subset of said data bits and a corresponding check bit results in a given syndrome bit.

5. The system as recited in claim 4, wherein said second error correction unit is further configured to accept said data block without modification in response to determining that each of said syndrome bits of said syndrome vector is equal to zero corresponding to no errors being detected.

6. The system as recited in claim 5, wherein said second bus interface unit is further configured to either generate an unrecoverable error message or request a re-operation on said data block in response to said second error correction unit determining that said syndrome vector is identical to a predetermined special vector corresponding a paired double bit error being detected.

7. The system as recited in claim 6, wherein said predetermined special vector includes a total number of bits that is equal to said total number of syndrome bits of said syndrome vector, and wherein said predetermined special vector includes at least two binary one bits.

8. The system as recited in claim 7, wherein said second error correction unit is further configured to generate a plurality of assignment vectors, one for each bit of said data block, wherein each bit of a given assignment vector is indicative of which of said plurality of syndrome bits a corresponding bit of said data block contributes.

9. The system as recited in claim 8, wherein said second error correction unit is further configured to identify a position of one of said plurality of bits of said data block containing an error and to invert said erroneous bit in response to determining that said syndrome vector is equal to one of said assignment vectors corresponding to said one of said plurality of bits of said data block containing an error.

10. The system as recited in claim 9, wherein said second bus interface unit is further configured either to generate an unrecoverable error message or to request a re-operation on said data block in response to said second error correction unit determining that each of said syndrome bits of said syndrome vector is not equal to zero, is not identical to each bit of said predetermined special vector, and is not identical to any of said plurality of assignment vectors.

11. The system as recited in claim 10, wherein each of said plurality of assignment vectors that corresponds to a check bit of said data block only contributes to one corresponding syndrome bit.

12. The system as recited in claim 11, wherein each of said plurality of assignment vectors that corresponds to a data bit of said data block contributes to at least two syndrome bits.

13. The system as recited in claim 12, wherein an exclusive-OR operation of assignment vectors corresponding to paired bits of said data block results in said predetermined special vector.

14. The system as recited in claim 13, wherein each of said plurality of assignment vectors corresponding to each of said plurality of bits of said data block is unique.

15. The system as recited in claim 14, wherein said predetermined special vector is different from each of said plurality of assignment vectors corresponding to each of said plurality of bits of said data block.

16. A system for detecting and correcting errors in a data block, wherein said data block includes a plurality of bits, wherein said plurality of bits includes data bits and check bits, said system comprising:
    a bus including a plurality of data paths for conveying said data block, wherein said plurality of data paths is fewer than said plurality of bits, and wherein paired bits of said data block are conveyed on each of said plurality of data paths;
    wherein selected ones of said plurality of data paths convey paired data bits, wherein each of said check bits is dependent upon one of but not both of said paired data bits conveyed on a given data path;
    a memory subsystem coupled to said bus, said memory subsystem including:
        a plurality of storage locations for storing said data block; and
        an error correction unit coupled to said bus, wherein said error correction unit is configured to receive said data block and to generate a syndrome vector including a plurality of syndrome bits dependent upon said check bits, and wherein said syndrome vector is used to detect and correct single bit errors and to detect paired double bits errors in said data block.

17. The system as recited in claim 16, wherein additional ones of said data paths convey a paired data bit/check bit.

18. The system as recited in claim 17, wherein each data bit associated with a given data bit/check bit pair is used to calculate each check bit other than said check bit associated with said given data bit/check bit pair.

19. The system as recited in any of claim 18, wherein an exclusive-OR operation of a given subset of said data bits and a corresponding check bit results in a given syndrome bit.

20. The system as recited in claim 19, wherein said second error correction unit is further configured to accept said data block without modification in response to determining that each of said syndrome bits of said syndrome vector is equal to zero corresponding to no errors being detected.

21. The system as recited in claim 20, wherein said memory subsystem is configured to either generate an unrecoverable error message or request a re-operation on said data block in response to said error correction unit determining that said syndrome vector is identical to a predetermined special vector corresponding a paired double bit error being detected.

22. The system as recited in claim 21, wherein said predetermined special vector includes a total number of bits that is equal to said total number of syndrome bits of said syndrome vector, and wherein said predetermined special vector includes at least two binary one bits.

23. The system as recited in claim 22, wherein said error correction unit is further configured to generate a plurality of assignment vectors, one for each bit of said data block, wherein each bit of a given assignment vector is indicative of which of said plurality of syndrome bits a corresponding bit of said data block contributes.

24. The system as recited in claim 23, wherein said error correction unit is further configured to identify a position of one of said plurality of bits of said data block containing an error and to invert said erroneous bit in response to determining that said syndrome vector is equal to one of said assignment vectors corresponding to said one of said plurality of bits of said data block containing an error.

25. The system as recited in claim 24, wherein said memory subsystem is further configured either to generate an unrecoverable error message or to request a re-operation on said data block in response to said error correction unit determining that each of said syndrome bits of said syndrome vector is not equal to zero, is not identical to each bit of said predetermined special vector, and is not identical to any of said plurality of assignment vectors.

26. The system as recited in claim 25, wherein each of said plurality of assignment vectors that corresponds to a check bit of said data block only contributes to one corresponding syndrome bit.

27. The system as recited in claim 26, wherein each of said plurality of assignment vectors that corresponds to a data bit of said data block contributes to at least two syndrome bits.

28. The system as recited in claim 27, wherein an exclusive-OR operation of assignment vectors corresponding to paired bits of said data block results in said predetermined special vector.

29. The system as recited in claim 28, wherein each of said plurality of assignment vectors corresponding to each of said plurality of bits of said data block is unique.

30. The system as recited in claim 29, wherein said predetermined special vector is different from each of said plurality of assignment vectors corresponding to each of said plurality of bits of said data block.

31. The system as recited in claim 29, wherein said error correction unit is further configured to generate said check bits for said data bits retrieved from said plurality of storage locations and to transfer said data block on said bus.

32. An apparatus for detecting and correcting errors in a data block, wherein said data block includes a plurality of bits including data bits and check bits, said apparatus comprising:
   a bus including a plurality of data paths for conveying said data block, wherein said plurality of data paths is fewer than said plurality of bits, and wherein paired bits of said data block are conveyed on each of said plurality of data paths;
   wherein selected ones of said plurality of data paths convey paired data bits, wherein each of said check bits is dependent upon one of but not both of said paired data bits conveyed on a given data path; and
   a receiver coupled to said bus, wherein said receiver is configured to receive said data block and to generate a syndrome vector including a plurality of syndrome bits dependent upon said check bits, and wherein said syndrome vector is used to detect and correct single bit errors and to detect paired double bits errors in said data block.

33. The apparatus as recited in claim 32, wherein additional ones of said data paths convey a paired data bit/check bit.

34. The apparatus as recited in claim 33, wherein each data bit associated with a given data bit/check bit pair is used to calculate each check bit other than said check bit associated with said given data bit/check bit pair.

35. The apparatus as recited in any of claim 34, wherein an exclusive-OR operation of a given subset of said data bits and a corresponding check bit results in a given syndrome bit.

36. The apparatus as recited in claim 35, wherein said receiver is further configured to accept said data block without modification in response to determining that each of said syndrome bits of said syndrome vector is equal to zero corresponding to no errors being detected.

37. The apparatus as recited in claim 36, wherein said receiver is further configured to either generate an unrecoverable error message or request a re-operation on said data block in response to said second error correction unit determining that said syndrome vector is identical to a predetermined special vector corresponding a paired double bit error being detected.

38. The apparatus as recited in claim 37, wherein said predetermined special vector includes a total number of bits that is equal to said total number of syndrome bits of said syndrome vector, and wherein said predetermined special vector includes at least two binary one bits.

39. The apparatus as recited in claim 38, wherein said receiver is further configured to generate a plurality of assignment vectors, one for each bit of said data block, wherein each bit of a given assignment vector is indicative of which of said plurality of syndrome bits a corresponding bit of said data block contributes.

40. The apparatus as recited in claim 39, wherein said receiver is further configured to identify a position of one of said plurality of bits of said data block containing an error and to invert said erroneous bit in response to determining that said syndrome vector is equal to one of said assignment vectors corresponding to said one of said plurality of bits of said data block containing an error.

41. The apparatus as recited in claim 40, wherein said receiver is further configured either to generate an unrecoverable error message or to request a re-operation on said data block in response to determining that each of said syndrome bits of said syndrome vector is not equal to zero, is not identical to each bit of said predetermined special vector, and is not identical to any of said plurality of assignment vectors.

42. The apparatus as recited in claim 41, wherein each of said plurality of assignment vectors that corresponds to a check bit of said data block only contributes to one corresponding syndrome bit.

43. The apparatus as recited in claim 42, wherein each of said plurality of assignment vectors that corresponds to a data bit of said data block contributes to at least two syndrome bits.

44. The apparatus as recited in claim 43, wherein an exclusive-OR operation of assignment vectors corresponding to paired bits of said data block results in said predetermined special vector.

45. The apparatus as recited in claim 44, wherein each of said plurality of assignment vectors corresponding to each of said plurality of bits of said data block is unique.

46. The apparatus as recited in claim 45, wherein said predetermined special vector is different from each of said plurality of assignment vectors corresponding to each of said plurality of bits of said data block.

47. An apparatus for detecting and correcting errors in a data block, wherein said data block includes a plurality of bits including D data bits and P check bits, said apparatus comprising:

a bus including a plurality of data paths for conveying said data block, wherein said plurality of data paths is fewer than said plurality of bits, and wherein paired bits of said data block are conveyed on each of said plurality of data paths; and a receiver coupled to said bus, wherein said receiver is configured to receive said data block and to generate a syndrome vector including a plurality of syndrome bits dependent upon said check bits, and wherein said syndrome vector is used to detect and correct single bit errors and to detect paired double bits errors in said data block;

wherein P is an integer no greater than necessary to satisfy the inequality $2^P > (D+P+1)$.

48. An apparatus for detecting and correcting errors in a data block, wherein said data block includes a plurality of bits including data bits and check bits, said apparatus comprising:

a bus including a plurality of data paths for conveying said data block, wherein said plurality of data paths is fewer than said plurality of bits, and wherein paired bits of said data block are conveyed on each of said plurality of data paths; and a receiver coupled to said bus, wherein said receiver is configured to receive said data block and to generate a syndrome vector including a plurality of syndrome bits dependent upon said check bits;

wherein said syndrome vector is used to detect and correct single bit errors and to detect paired double bits errors in said data block, wherein said paired double bit errors are detected if said syndrome vector is identical to a predetermined special vector.

* * * * *